United States Patent [19]

Myers

[11] Patent Number: 4,947,168

[45] Date of Patent: Aug. 7, 1990

[54] SUBRANGING ANALOG-TO-DIGITAL CONVERTER WITH CALIBRATION

[75] Inventor: Terrence L. Myers, Fullerton, Calif.

[73] Assignee: Hughes Aircraft Company, Los Angeles, Calif.

[21] Appl. No.: 197,733

[22] Filed: May 23, 1988

[51] Int. Cl.$^5$ .............................................. H03M 1/10
[52] U.S. Cl. ..................................... 341/120; 341/161
[58] Field of Search ................. 341/120, 121, 156, 161

[56] References Cited

U.S. PATENT DOCUMENTS

| | | | |
|---|---|---|---|
| 4,315,254 | 2/1982 | Honjyo et al. | 341/120 |
| 4,612,533 | 9/1986 | Evans | 341/120 |
| 4,639,715 | 1/1987 | Doluca | 341/120 |
| 4,799,041 | 1/1989 | Layton | 341/120 |

Primary Examiner—William M. Shoop, Jr.
Assistant Examiner—Marc S. Hoff
Attorney, Agent, or Firm—W. K. Denson-Low

[57] ABSTRACT

A successive sub-ranging A/D converter circuit is disclosed which incorporates adaptive error correction for a high accuracy digitization of analog input signals. The circuit comprises an A/D converter operative to convert analog input signals into a digital output signal, and a test circuit for generating digital signals to correct for errors in the A/D converter. The test circuit includes control circuitry for generating a series of digital test signals, and a highly accurate, first D/A converter for generating a respective series of analog test signals for communication to the input circuit. Circuitry is provided for combining the digital test signals with respective outputs of the least significant bit (LSB) quantizer of the A/D converter, and for generating a digital correction signal representative of the differences therebetween. The correction signals are representative of the corrected output of the A/D converter system, given the respective test signals and output signals from the LSB quantizer. A first memory storage device is provided for storing the correction signals at memory locations addressable by output signals from the MSB quantizer. Summing circuitry is connected to the memory storage device for selectively adding stored error correction signals to the output of the LSB quantizer to correct for offset errors unique to each sub-range segment that may be occupied by the analog input signal.

11 Claims, 4 Drawing Sheets

SUBRANGING ANALOG-TO-DIGITAL CONVERTER WITH CALIBRATION

TECHNICAL FIELD

This invention relates generally to analog-to-digital converters and more particularly to a subranging type analog-to-digital converter with automatic calibration capabilities.

BACKGROUND OF THE INVENTION

There is a current need for analog-to-digital (A/D) converters having a high bit resolution and data conversion rate in the megahertz range, and having a high degree of stability and precision.

Subranging type A/D converters have been used to take advantage of an inherent capability to do high resolution data conversion with a reduced data processing delay time. Such A/D converters typically include at least two parallel circuit paths; one of which converts the analog signal to a coarse digital word indicative of the most significant bit portion of the converted analog signal, and the second of which converts the analog signal to a fine digital word indicative of the least significant bit portions of the converted analog signal. In the most significant bit, coarse word circuit path, a flash converter or quantizer is utilized to digitize the analog signal. This digitized signal is then reconverted to an analog signal indicative of the most significant bits or coarse word portion of the converted analog signal, and is subtracted from the delayed analog input signal in the least significant bit, or fine word circuit path. The resulting difference analog signal is digitized to form the least significant bits or fine word portion of the digitized input signal. The digitized most significant bits and least significant bits are then combined to produce an output signal.

In a number of applications, such as in radar systems, analog input data is generally gathered over very small intervals of time. A/D converters useful in such applications operate to divide the analog input data into very small data samples, and then convert those data samples into digital numbers for processing purposes in a digital signal processor. Besides very high conversion rates, A/D converters used for such applications must have more bits in the converted digital word, to obtain the desired resolution.

The high speed and high accuracy requirements placed upon A/D converters in various applications typically impose conflicting design demands on the circuit. For example, to satisfy the high speed requirements conventional A/D conversion circuits must typically operate with low impedances and have other operating characteristics which generally limit the accuracy obtainable from such circuits. Though certain components may be constructed in a manner to obtain both high speed and acceptable accuracy, those components are typically expensive and, in any case, serve as the limiting factor in the speed and/or accuracy of the conversion circuit. Moreover, many contemporary converters suffer additional limitations attributable to the use of redundant analog circuitry to generate a series of error correction signals in an effort to provide greater accuracy.

For example, in the circuit disclosed in U.S. Pat. No. 4,342,983, DYNAMICALLY CALIBRATED SUCCESSIVE RANGING A/D CONVERSION SYSTEM AND D/A CONVERTER FOR USE THEREIN, to Weigand, an analog test signal is input to the circuit and an analog correction signal is derived to represent errors corresponding to certain cardinal points in the range of the circuit. The error signal is fed back to offset an analog signal in the converter circuit. Generation of a correction signal corresponding to each of the cardinal points wherein correction is made requires dedicated analog circuitry for the generation of each correction signal. That requirement tends to limit the number of correction points utilized. Moreover, the circuit is limited to corrections in the D/A circuitry, and does not permit compensation for errors in digital quantization.

Other contemporary A/D converters incorporate circuitry operative to compensate for errors in digital quantization, but fail to provide means for providing high accuracy compensation for errors in the D/A circuitry.

The present invention is directed to apparatus and a method for providing an adaptive error correction circuit for digitizing high speed input data, which compensates for errors in all components of the circuit. The present invention avoids the need for extremely high speed, high accuracy components, by segregating high speed data conversion circuitry from high accuracy error correction circuitry. The invention provides for a large number of error correction points without any requirement for redundant analog circuitry.

These and other objects and advantages of the invention are described and illustrated in connection with the exemplary embodiments set forth below.

SUMMARY OF THE INVENTION

A successive sub-ranging A/D converter system is disclosed which incorporates adaptive error correction for a high accuracy digitization of analog input signals. The circuit comprises an A/D converter operative to convert analog input signals into a digital output signal, and a test circuit for generating digital signals to correct for errors in the A/D converter. The test circuit includes control circuitry for generating a series of digital test signals, and a highly accurate, first D/A converter for generating a respective series of analog test signals for communication to the input circuit. Circuitry is provided for combining the digital test signals with respective outputs of the least significant bit (LSB) quantizer of the A/D converter, and for generating a digital correction signal representative of the differences therebetween. The correction signals incorporate corrections for residue errors introduced by the high speed second D/A converter and the associated amplifier. A first memory storage device is provided for storing the correction signals at memory locations addressable by output signals from the MSB quantizer. Summing circuitry is connected to the memory storage device for adding error correction signals to the output of the LSB quantizer to correct for errors peculiar to each sub-range segment of the analog input signal.

The A/D converter includes an MSB quantizer for generating a coarse digital signal representative of the analog input. The coarse digital signal is converted to an analog signal by a fast D/A converter and then compared, in a residue amplifier, to the analog input signal. The difference signal output from the residue amplifier is digitized in the LSB quantizer, which provides a fine correction to the coarse digital signal. (In the calibration phase the output of the LSB quantizer is compared to the corresponding digital test signal, with the resulting difference signal being a digital correction signal which incorporates corrections for all errors within the circuit for each particular analog input signal segment.) The coarse digital signal is also communicated as an address to the first memory storage device which stores the digital correction signal for the sub-range attributable to the uncorrected, or coarse MSB output signal. The output of the LSB quantizer is combined with the digital correction signal and then output from the circuit.

In the presently preferred embodiment the first D/A converter circuit comprises a high impedance, high accuracy D/A circuit, which operates at a relatively low speed to produce a high accuracy analog representation of the digital test signals. The second D/A converter operates at a high speed, and results in a less accurate analog conversion of the test signal. The invention permits a highly accurate digitization of the input signal without requiring that the second D/A converter be highly accurate. High accuracy is obtained by the advantageous use of the first D/A converter, operating at the slower speed, and the error storage and correction circuitry utilizing highly accurate calibration information generated by the first D/A converter. Consequently, the invention separates the requirements of high accuracy from high speed to obtain both advantages without requiring both functions to be dependent upon the operation of a single device. Highly accurate error correcting information may be automatically accumulated during dead time interval between sampling periods, with all gain and offset errors calibrated out of the circuit components to permit most accurate error correction.

DETAILED DESCRIPTION OF THE PRESENTLY PREFERRED EMBODIMENT

Figure 1:
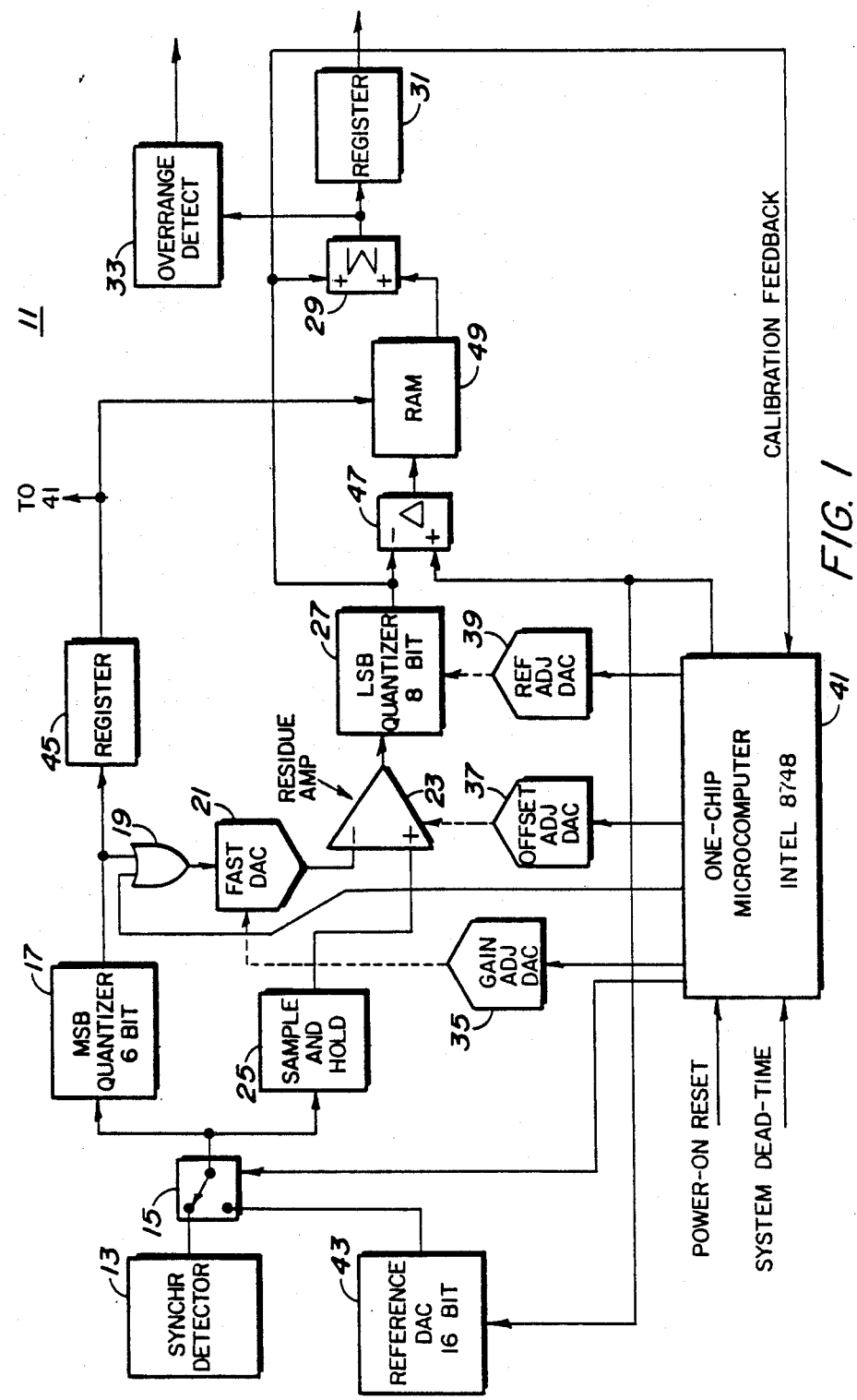
FIG. 1 is a schematic diagram of the preferred embodiment of the digital to analog converter with the calibration and adjustment features.

The detailed description set forth below in connection with the appended figures is intended merely as a description of the presently preferred embodiment of the invention, and is not intended to represent the only form in which the present invention may be constructed or utilized. The description sets forth the functions and sequence of events that are effected by the invention in connection with the illustrated embodiment. It is to be understood, however, that the same, or equivalent functions or sequences may be accomplished by different embodiments that are also intended to be encompassed within the spirit and scope of the invention.

OVERVIEW OF THE INVENTION

The principles of this invention are embodied in a sub-ranging type A/D converter which is capable of automatic calibration during periodic system dead time intervals. The sub-ranging type A/D converter portion of the embodiment includes a coarse conversion circuit path and a fine conversion circuit path for converting an input analog signal to a coarse digital word, indicative of the most significant bits, and a fine digital word, indicative of the least significant bits. The coarse A/D converter uses a high speed converter, such as a quantizer or a flash converter to produce a data word indicative of the most significant bits. The most significant bits data word, is reconverted from digital to analog signal and subtracted from the input analog signal in the fine conversion circuit path to obtain a residue analog signal corresponding to the least significant bit range. That residue analog signal is then converted to a fine digital word signal using a high speed flash converter.

During periodic system dead time intervals the embodiment automatically calibrates the high speed A/D converter and the high speed D/A converter portions of the circuit and adaptively corrects for errors. This is accomplished with a precision D/A feedback loop which is under the control of a digital processor. All gain errors and offset errors are automatically calibrated out of the circuit with the use of digital test words from the digital processor.

Specifically the digital processor generates a series of test words which step through and are indicative of the mid-point of each sub-range segment. The digital test word is fed to the precision D/A converter to generate a corresponding analog test signal for each test range. The analog test signal is then fed to the coarse and fine circuits, with the resulting fine word portion subtracted from the digital test signal. The difference signal is the correction number that will need to be added to the fine quantizer output whenever that same subrange segment is occupied in the course of sampling actual signal voltages. It is stored in RAM memory with an address identified by the state of the MSB quantizer, i.e. the coarse A/D converter. (The MSB quantizer outputs a set of bits that identifies the RAM memory address.) For the higher resolution implementations of this invention, it is recommended that several digital data samples be taken at each calibration point and that they be averaged in the digital processor to reduce the effects of noise before storage in the RAM. Upon completion of the calibration sequence the RAM holds a set of unique correction numbers for each sub-range segment. In data operation the converter forms corrected digital output signals or words by adding the output of the LSB quantizer to the correction number designated by the state of the most significant bit word. The correction numbers may be continually updated by re-performing all or a portion of the error correction sequence during each system dead time.

Features and advantages of this invention include the separation of the high speed data conversion circuit elements from the slower speed precision circuit elements used for calibration and adjustment. As a result the circuit is able to take advantage of the favorable characteristics of each of the circuits without having to make tradeoffs or compromises on a speed versus accuracy basis. Thus the invention is able to make use of fast settling, high speed data circuits, without the compromises that would be necessary to also preserve high accuracy and low drift in those circuits. By the use of a digital processor it is possible for the circuit to initially set up automatically without the need for manual trimming and adjustments. Moreover most of the circuits in the system are digital, thus taking advantage of the lower production cost, the higher reliability and the adaptability to packaging in smaller areas, as compared to analog circuits. Additionally, because of the continual adaptive adjustments of the circuit there is no need for periodic manual calibrations. This thus allows for automatic tracking over a wide temperature range.

DETAILED DESCRIPTION OF THE ILLUSTRATED EMBODIMENT

Referring now to the drawings in more detail, FIG. 1 schematically illustrates an A/D converter 11 of the subranging type having initial adjustment and automatic calibration capabilities.

As will be explained in more detail subsequently the subranging type A/D converter 11 converts analog input signals received from switch 15 by means of a coarse circuit, which converts the analog signal to the digital word representing the most significant bits, and a fine circuit, which converts the analog input signal to a digital word representing the least significant bits.

More specifically, data input device 13 operates to generate analog data which is input to the converter 11 via switch 15. The analog data is communicated to both coarse and fine conversion paths which both operate to produce digital output signals. Analog data received at input switch 15 is communicated to the most significant bit (MSB) quantizer, which performs a coarse digitization of the received analog signal. The coarse digital signal is communicated to fast digital analog converter (DAC) 21 wherein the signal is converted back to an analog signal, roughly equivalent to the signal input received via input switch 15. The analog signal from fast DAC 21 is communicated to a residue amplifier 23, which also receives the analog input signal from the input switch 15, delayed by sample and hold device 25. DAC 21 may be implemented, for example, by a model ADC 00300, made by ILC Data Devices Corporation, 105 Wilbur Place, Bohemia, N.Y. The delayed analog input signal and the analog representation of the coarse digital signal are compared at residue amplifier 23 and the resulting difference signal is communicated to the least significant bit (LSB) quantizer 27. The output of residue amplifier 23 is generally representative of the discrepancy between the delayed input signal and the reformulated analog signal, and is an analog representation of inaccuracy in the coarse signal path. LSB quanitzer 27 is operative to generate a digital signal, representative of the analog signal output from the residue amplifier 23. The digital output of LSB quantizer 27 is combined with a signal stored in RAM 49 (the coarse digital signal corrected as described below) in summing circuit 29. The signal from summing circuit 29 represents a high accuracy digitization of the data signal input from data input device 13. That signal is communicated to output register 31 and to overrange detect device 33.

Correction of the coarse digital signal output from MSB quantizer 17 occurs in the following manner. Initially, it should be noted that the fast DAC 21, residue amplifier 23 and LSB quantizer 27 must be calibrated to remove zero errors in the components and adjust for scaling. As described below such calibration is affected by gain adjust digital to analog converter (DAC) 35, offset adjust DAC 37 and reference adjust DAC 39. DACs 35, 37 and 39 may be implemented, for example, by a model AD 558 from Analog Devices, One Technology Way, Norwood, Mass. 02062-9106. Once those calibration procedures have been implemented, the circuit is in condition for further error correction to produce a high accuracy digital representation of the analog input signal.

The converter circuit 11 is operative to generate a series of digital test signals which are used to determine the accuracy of the converter circuit for a large number of input signal segments. The correction signal for each segment is stored and later recalled whenever the input signal corresponds to that particular segment.

Microcomputer 41 is a digital processor operative to generate a series of digital test signals, the analog conversion of which corresponds to a definable analog signal segment for which the corresponding error signal is to be determined and stored. Microcomputer 41 is operative to communicate the digital test signals to reference DAC 43. The reference DAC 43 is a high impedance, high accuracy device, such as DAC 02900 made by ILC Data Devices, which is effective to provide an analog signal which is a highly accurate analog representation of the digital test signal received from microcomputer 41. In order to provide the high accuracy analog conversion, reference DAC 43 is typically characterized by a longer settling time, e.g. 10 microseconds, and a higher impedance, than would be generally acceptable for use to perform the functions of fast DAC 21. By comparison, fast DAC 21 has a much shorter settling time, e.g. fifty nanoseconds, and a lower impedance. Consequently, reference DAC 43 is particularly suited to generating a high accuracy analog test signal which can be used to derive error correction information corresponding to variations in the operation of each of the components in the coarse and fine digital signal paths over a wide spectrum of analog signal segments.

The analog test signal output from reference DAC 43 is communicated to input switch 15 which, under the control of microcomputer 41, operates to input the analog test signal into the circuit as it would an analog data signal from data input device 13. As with a data input, the test signal is communicated to MSB quantizer 17, which generates a coarse digital representation of the analog test signal. That signal is then communicated to register 45 and microcomputer 41. The microcomputer 41 also receives the fine digital signal communicated from the output LSB quantizer 27. Comparator 47 operates to compare the digital test signal with the fine digital signal output from LSB quantizer 27. The difference between those signals is communicated to RAM 49, which also receives the coarse digital signal from LSB quantizer 17, delayed by register 45. RAM 49 operates to store the difference signal from comparator 47 at address locations corresponding to the coarse digital signal received from register 45. As microcomputer 41 progressively steps through a number of digital test signals, respective error signals are stored in RAM 49, addressable by the signal output from MSB quantizer 17. It should therefore be understood that the signal from subtractor 47 represents the subrange segment correction number, i.e. the difference between the fine digitization signal 27 and the desired full resolution A/D converter system output, for the subrange segment corresponding to each particular test signal step. Error correction for the operation of the circuit components is, therefore, incorporated into the signal output from coarse quantizer 17.

When the converter circuit 11 is then operated in a data input mode, the appropriate corrected digital signal is generated by RAM 49 in response to address information received from MSB quantizer 17. The output of RAM 49 is combined with the output of LSB quantizer 27 in summing circuit 29 and output to external circuitry thereafter.

As previously indicated, calibration of various circuit components takes place before the above described error correction technique is implemented. The description below sets forth the calibration routine in greater detail.

CALIBRATION SEQUENCE

It is to be understood that the particular calibration sequence is variable in accordance with the particular circuitry used to implement the invention. The common feature of the selected sequence being that it is effective to null out offset errors and adjust the gain of the circuit components for proper scaling over a wide range of input signal levels. The procedure described below is therefore intended to represent only one of a number of potential calibration sequences to implement the zero adjust and gain adjust features. The adjustments may be repeated for each input signal segment and stored to be recalled when the corresponding signal segment is recognized. The resolution of the calibration sequence, i.e. the number of points for which the circuit is calibrated for each signal segment, may be varied as desired. In the presently preferred embodiment one calibration is performed for each signal segment, i.e. for each subrange, with the calibration being effected at substantially the midpoint of each subrange. An exemplary calibration procedure is set forth below, with corresponding illustration set forth at FIGS. 2 and 3.

Figure 2:
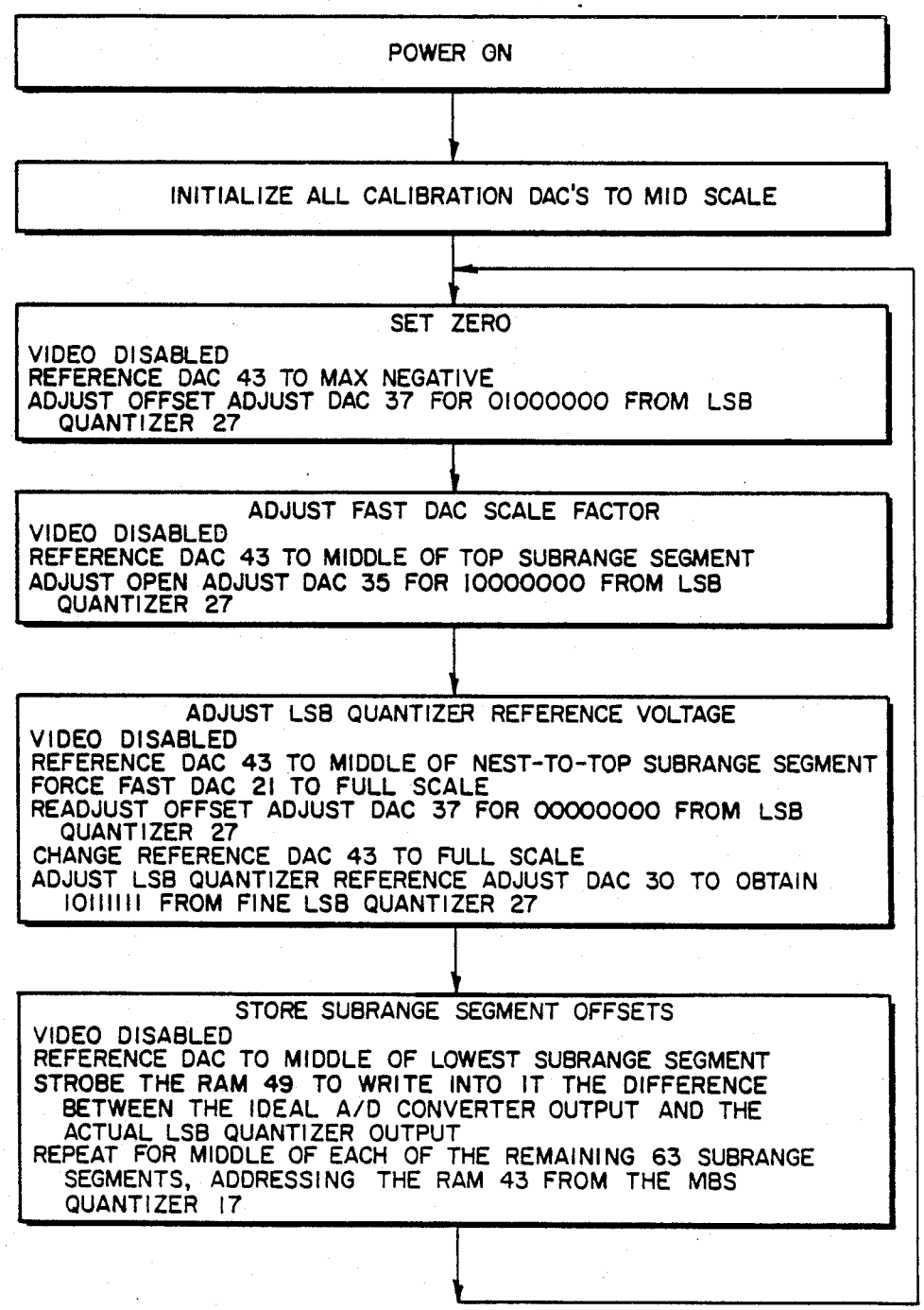
FIG. 2 is a flow diagram illustrating the mode of operation of the analog-to-digital converter of FIG. 1.
Figure 3:
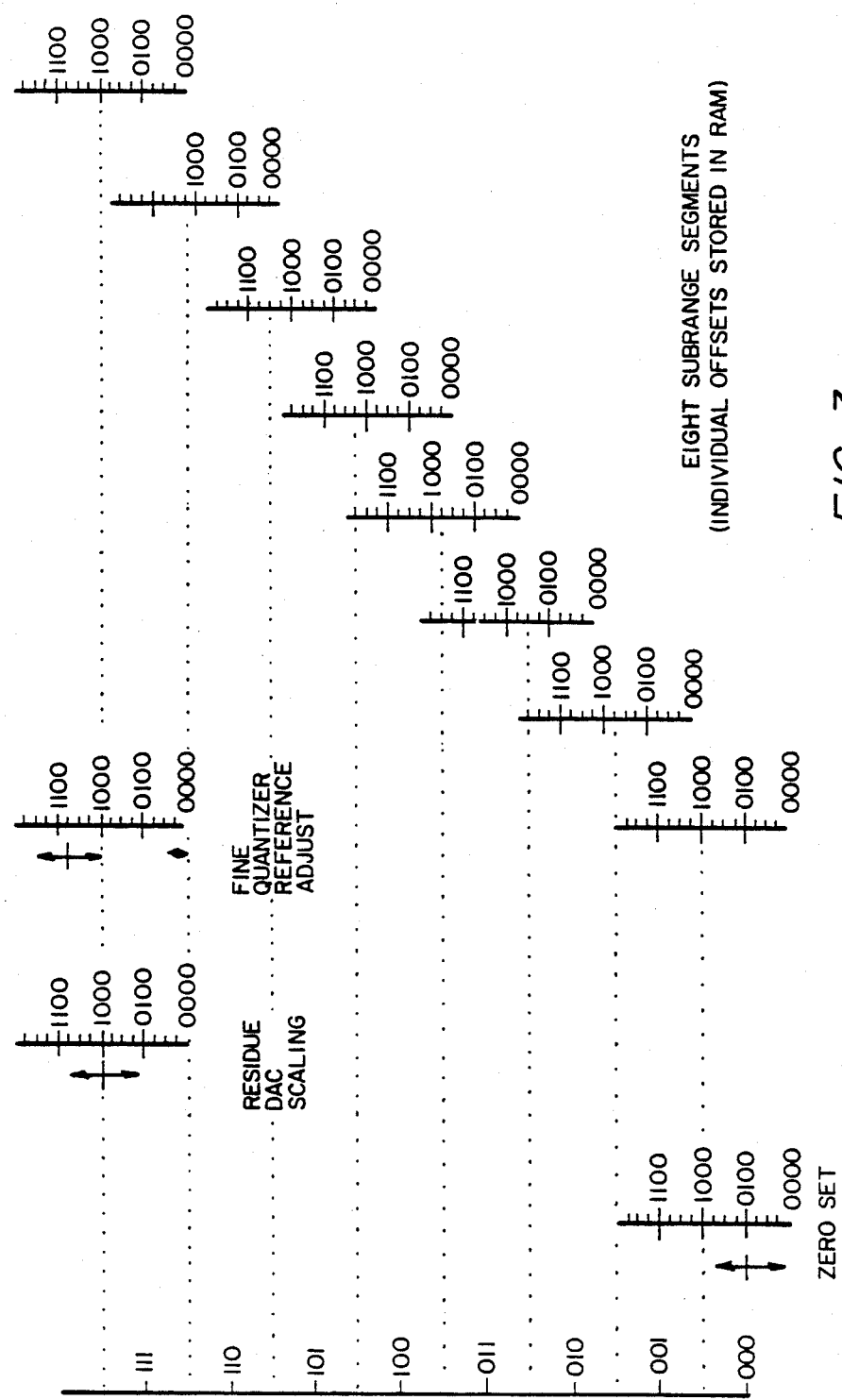
FIG. 3 is a diagram illustrating the test words used for the calibration and adjustment of the digital-to-analog converter of FIG. 1.
Figure 4:
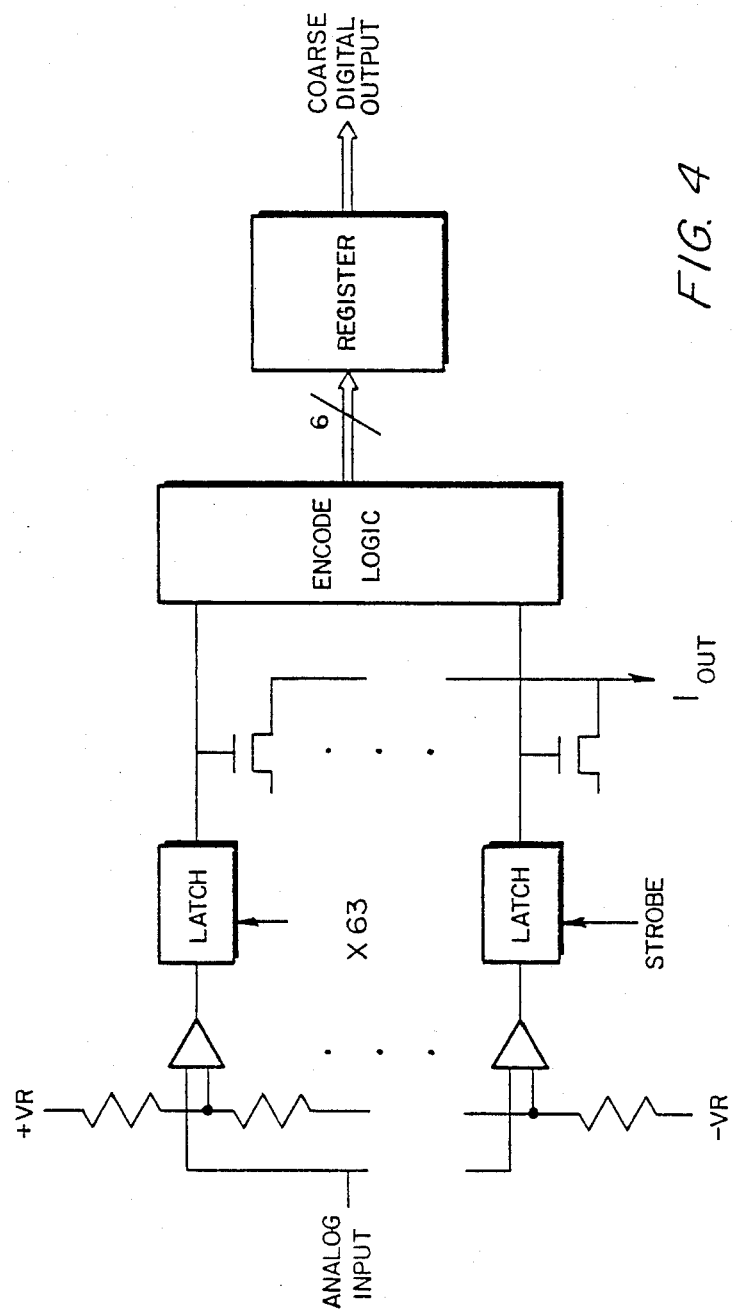

FIG. 2 is a flow chart of an exemplary calibration sequence. A bar graph illustrating the exemplary subrange segments for which the calibration routine is performed is set forth at FIG. 3. An exemplary calibration procedure for an 11 bit converter is as follows:

INITIALIZATION

Initialize the gain adjust DAC 35 to half scale (10000000). Initialize the offset adjust DAC 37 to half scale (10000000). Initialize the reference adjustment DAC 39 to half scale (10000000).

Zero Set

Disable the video data input and set input switch 15 to connect the reference DAC 43. Set reference DAC 43 to output a maximum negative signal (000000000000). This will produce a 000000 code from the MSB quantizer 17 so that it will not influence the zero set result.

Read the output code from the LSB quantizer 27 and compare it to the ideal code of 010000. If the ideal code is not output, adjust offset adjustment DAC 37 till that code is output from LSB quantizer 27.

Fast DAC Scaling Adjustment

Disable the video data input and connect the operate switch 15 to input a test signal from the reference DAC 43. Set up the reference DAC to the middle of the top sub-range segment (111111100000).

Read the output code from the LSB quantizer 27 and compare it to the ideal code of 100000. Adjust gain adjustment DAC 35 till that code is output from LSB quantizer 27.

LSB Quantizer Reference Adjustment

Disable the video data input and operate switch 15 to input a test signal from the reference DAC 43. Set up the reference DAC 43 to the middle of the next to top sub-range segment (111110100000).

Activate the forcing circuit 19 (which uses wire-OR's on the coarse quantizer's output,) causing the fast DAC 21 to go to 11111100.

Read the output code from the LSB quantizer. If it is not zero, calculate the increment that will bring it to below zero and modify the setting of the offset adjust DAC 37 accordingly. If it is zero, raise the setting of the offset adjust DAC 37 by one lsb.

Repeat until the output code from the LSB quantizer changes to 000001. This establishes the bottom of the fine quantizer's range. The first bit transition is established from the bottom side to avoid hysteresis error.

Set up the reference DAC 43 to just short of full scale (111111111100).

Read the output code from the LSB quantizer 27 and compare it to 101110.

Increment or decrement the reference adjust DAC 39 to bring the LSB quantizer output code to 101110.

After each adjustment, wait long enough for the residue amplifier 23 to catch up.

Repeat until the LSB quantizer output code is 101110.

Increment the state of the LSB quantizer reference adjust DAC 39 an lsb at a time, with a wait after each step, until the LSB quantizer output code changes to 101111. This establishes the gain at the almost ¾ point of the fine quantizer's range.

Segment Offset Storage

Disable the video data input and connect the reference DAC. Set up the reference DAC 43 to 000000100000.

Strobe the RAM 49 to write into it the difference between the ideal and actual LSB quantizer output.

Advance the state of the reference DAC 43 by 000001000000.

Steps will be 000000100000, 000001100000, 000010100000, etc.

Repeat the preceding two steps until all 64 segments have been sampled (last step is 111111100000).

Maintaining Calibration

The above steps (except for the initialization) may be repeated periodically during system dead times. The zero set and fast DAC scaling procedures can be given windows of acceptance according to the amount of redundant states that can be budgeted to those error sources.

As will be apparent to those skilled in the art, various alternate processing schemes and calibration routines may be used to implement the innovative features of the present invention. For example, for higher resolution applications (e.g. input signals of 13 bits or more) the efficiencies obtained by simultaneously effecting the functions of HSB quantizer 17 and sample and hold circuit 25 may not be available. In such applications it is anticipated that MSB quantizer 17 and sample and hold circuit 25 would be serially connected to insure that appropriate signals appear at the inputs of residue amplifier 23 at the correct time. The particular data format, processing scheme and calibration routine may, therefore, be varied in accordance with the particular application without departing from the spirit and scope of the present invention.

What is claimed is:

1. In a successive sub-ranging analog-to-digital conversion circuit having an adaptive error correction circuit, the improvement characterized in that:

an input circuit for receiving analog data input signals and analog test input signals and for selectively communicating said input signals to the analog-to-digital conversion circuit;

a test circuit connected to the input circuit, said test circuit being operative to generate error correction signals to correct for errors in the operation of the analog-to-digital converter circuit, said test circuit comprising:

control circuitry for generating a series of digital test signals, each of said test signals corresponding to an amplitude sub-range;

a first digital-to-analog converter for receiving said series of digital test signals and generating a respective series of corresponding analog test signals, said analog test signals being communicated to said input circuit; and comparison circuit for comparing each of the series of digital test signals with a corresponding first digital output signals from the analog-to-digital converter circuit, and for generating a digital error correction signal representative of the difference therebetween;

a first memory storage device connected to said test circuit for storing the digital error correction signals corresponding to each of the respective series of digital test signals, said error correction signals being stored at memory locations addressable upon receipt of second digital output signals from said analog-to-digital converter circuit; and summing circuitry for generating third digital output signals by adding said digital error correction signals received from the first memory storage device to said first digital output signals received from the analog-to-digital converter circuit when analog data input signals are received at the input circuit.

2. The circuit as recited in claim 1 wherein the first memory storage device comprises a random access memory.

3. The circuit as recited in claim 1 wherein the analog-to-digital converter circuit comprises:

a most significant bit quantizer connected to the input circuit;

a second digital-to-analog converter having an input connected to receive an output from the most significant bit quantizer;

a residue amplifier having a first input in electrical communication with the second digital-to-analog converter and a second input in electrical communication with the input circuit, the residue amplifier being operative to generate an output difference signal; and a least significant bit quantizer having an input connected to the residue amplifier.

4. The circuit as recited in claim 3 wherein the most significant bit quantizer is operative to generate the second digital output signals.

5. The circuit as recited in claim 3 wherein the least significant bit quantizer is operative to generate the first digital output signals.

6. The circuit as recited in claim 1 wherein:

the analog-to-digital conversion circuit is operative to convert analog data input signals into third digital output signals in accordance with the amplitude subrange of analog data input signals received at the input circuit; and wherein each of the analog test input signals correspond to the mid-point of an amplitude subrange.

7. The circuit as recited in claim 3 wherein the analog-to-digital converter circuit further comprises gain adjust circuitry for adjusting the gain of the second digital-to-analog converter, offset adjust circuitry for removing zero level errors from the residue amplifier, and reference adjust circuitry for adjusting the gain of the least significant bit quantizer.

8. The circuit as recited in claim 3 wherein the second digital-to-analog converter has a settling time of approximately fifty nanoseconds.

9. The circuit as recited in claim 3 wherein the first digital-to-analog converter has a settling time of approximately ten microseconds.

10. The circuit as recited in claim 5 wherein the second digital output signals are representative of a coarse digital quantization of the analog data input signal received at the input circuit, said first digital output signals are representative of a fine digital quantization of the analog data input signal and said third digital output signals are representative of a digital quantization of the analog input signal corrected to remove errors corresponding to the operation of the conversion circuit in response to the amplitude subrange of a received analog input signal.

11. A method of adaptive conversion of analog signals to digital signals comprising:

inputting a series of analog test signals to a sub-ranging analog-to-digital converter, said analog-to-digital converter having a coarse quantization circuit and a fine quantization circuit, each of said test signals corresponding to the mid-point of an analog amplitude sub-range;

comparing the output of the fine quantization circuit to a digital representation of each analog test signal;

generating digital error signals corresponding to the difference between the compared signals, said error signals corresponding to errors in the quantization and reconstruction of each of the analog test signals;

storing each error signal in a memory storage location, said memory storage location being addressable by the output from the coarse quantization circuit;

inputting a series of analog data signals to the analog-to-digital converter; and selectively adding a stored error correction signal to the output of the fine quantization circuit to correct for errors in digitization and reconstruction of each of the input analog data signals, the added error correction signal being selected in response to the instantaneous amplitude subrange segment occupied by the input analog data signal.

* * * * *